(12) United States Patent
Takahashi

(10) Patent No.: US 10,199,452 B2
(45) Date of Patent: Feb. 5, 2019

(54) SEMICONDUCTOR DEVICE

(71) Applicant: Kabushiki Kaisha Toshiba, Minato-ku, Tokyo (JP)

(72) Inventor: Keita Takahashi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/708,243

(22) Filed: Sep. 19, 2017

(65) Prior Publication Data

US 2018/0277625 A1  Sep. 27, 2018

(30) Foreign Application Priority Data

Mar. 24, 2017 (JP) .................. 2017-060012

(51) Int. Cl.
*H01L 29/06* (2006.01)
*H01L 27/092* (2006.01)

(52) U.S. Cl.
CPC ...... *H01L 29/0615* (2013.01); *H01L 27/0928* (2013.01)

(58) Field of Classification Search
CPC ............. H01L 29/0615; H01L 27/0928; H01L 29/1095; H01L 29/0878; H01L 29/7816
See application file for complete search history.

(56) References Cited

U.S. PATENT DOCUMENTS

| | | | |
|---|---|---|---|
| 7,906,808 B2 | 3/2011 | Matsudai et al. | |
| 8,890,243 B2 | 11/2014 | Yanagi | |
| 9,142,554 B2 | 9/2015 | Chen et al. | |
| 2017/0162690 A1* | 6/2017 | Edwards | H01L 29/7816 |
| 2017/0200785 A1* | 7/2017 | Janssens | H01L 23/552 |
| 2017/0250277 A1* | 8/2017 | Wu | H01L 29/7823 |
| 2017/0301590 A1* | 10/2017 | Anderson | H01L 21/823885 |
| 2017/0323831 A1* | 11/2017 | Jeong | H01L 21/823418 |
| 2017/0338304 A1* | 11/2017 | Janssens | H01L 29/063 |

FOREIGN PATENT DOCUMENTS

| | | |
|---|---|---|
| JP | 2010-283366 A | 12/2010 |
| JP | 2013-115166 A | 6/2013 |
| JP | 2014-096583 A | 5/2014 |

* cited by examiner

*Primary Examiner* — Nathan W Ha
(74) *Attorney, Agent, or Firm* — White & Case LLP

(57) ABSTRACT

A semiconductor device according to an embodiment includes a semiconductor substrate, source electrodes, drain electrodes provided between the source electrodes, gate electrodes provided between the source electrodes and the drain electrodes, first p-type region in the semiconductor substrate, n-type source regions in the semiconductor substrate extending in a first direction and electrically connected to the source electrodes, n-type drain regions in the semiconductor substrate extending in the first direction and electrically connected to the drain electrodes, and first n-type regions extending in the first direction, the first p-type region interposed between the first n-type regions and the n-type source regions, the first p-type region interposed between the first n-type regions and the n-type drain regions. A distance between one first n-type region among the first n-type regions and the source electrodes is less than a distance between the one first n-type region and the drain electrodes.

19 Claims, 7 Drawing Sheets

SEMICONDUCTOR DEVICE

CROSS-REFERENCE TO RELATED APPLICATION

This application is based upon and claims the benefit of priority from Japanese Patent Application No. 2017-060012, filed on Mar. 24, 2017, the entire contents of which are incorporated herein by reference.

FIELD

Embodiments described herein relate generally to semiconductor devices.

BACKGROUND

In some cases, when a switching transistor of a circuit that applies a current to an inductive load is turned off, return current flows to a body diode of the switching transistor. In this case, for example, when the amount of current that flows to a substrate of the transistor increases, latch-up occurs due to the operation of a parasitic thyristor. As a result, there is a concern that the transistor will be broken.

DETAILED DESCRIPTION

Figure 1A:
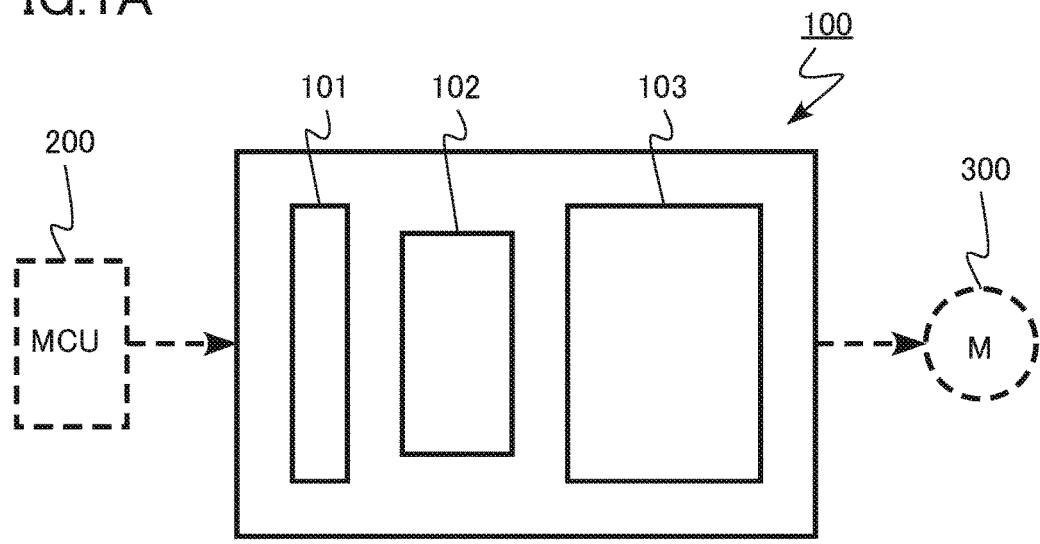
FIGS. 1A and 1B are diagrams schematically illustrating a semiconductor device according to an embodiment.

A semiconductor device according to an embodiment includes: a semiconductor substrate having a first plane and a second plane; a plurality of source electrodes provided on the first plane; a plurality of drain electrodes provided on the first plane, the plurality of drain electrodes provided between the plurality of source electrodes; a plurality of gate electrodes provided on or above the first plane, the plurality of gate electrodes provided between the plurality of source electrodes and the plurality of drain electrodes; a first p-type region provided in the semiconductor substrate, a plurality of n-type source regions provided in the semiconductor substrate, the plurality of n-type source regions extending in a first direction, the plurality of n-type source regions being electrically connected to the plurality of source electrodes; a plurality of n-type drain regions provided in the semiconductor substrate, the plurality of n-type drain regions extending in the first direction, the plurality of n-type drain regions being electrically connected to the plurality of drain electrodes; and a plurality of first n-type regions provided in the semiconductor substrate, the plurality of first n-type regions extending in the first direction, the first p-type region being interposed between the plurality of first n-type regions and the plurality of n-type source regions, the first p-type region being interposed between the plurality of first n-type regions and the plurality of n-type drain regions, wherein a distance between one first n-type region among the plurality of first n-type regions and the plurality of source electrodes is less than a distance between the one first n-type region and the plurality of drain electrodes.

In the specification, in some cases, the same or similar members are denoted by the same reference numerals and the description thereof will not be repeated.

In the specification, in some cases, in order to show the positional relationship between, for example, components, the upper direction in the drawings may be described as "on" or "above", and the lower direction in the drawings may be described as "under" or "below". In the specification, the terms "on", "above", "under" and "below" do not necessarily indicate the relationship with the direction of gravity.

In the following description, $n^+$, $n$, $n^-$, $p^+$, $p$, and $p^-$ indicate the relative impurity concentration levels of each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and $p^-$ indicates a p-type impurity concentration which is lower than that of p. In some cases, an $n^+$ type and an $n^-$ type are simply represented by an n type and a $p^+$ type and a $p^-$ type are simply represented by a p type.

Impurity concentration can be measured by, for example, secondary ion mass spectrometry (SIMS). In addition, the relative levels of the impurity concentration can be determined from the levels of carrier concentration calculated by, for example, scanning capacitance microscopy (SCM). The distance of an impurity region, such as the depth or thickness of the impurity region, can be calculated by, for example, SIMS. Furthermore, the distance of the impurity region, such as the depth, thickness, width, or interval of the impurity region, can be calculated from, for example, a composite image of an SCM image and an atomic force microscope (AFM) image.

A semiconductor device according to an embodiment includes: a semiconductor substrate that has a first plane and a second plane and includes a first p-type region; a plurality of source electrodes provided on the first plane; a plurality of drain electrodes provided between the plurality of source electrodes on the first plane; a plurality of gate electrodes provided between the plurality of source electrodes and the plurality of drain electrodes on the first plane; a plurality of n-type source regions that are provided in the semiconductor substrate so as to extend in a first direction and are electrically connected to the plurality of source electrodes; a plurality of n-type drain regions that are provided in the semiconductor substrate so as to extend in the first direction and are electrically connected to the plurality of drain electrodes; and a plurality of first n-type regions that are provided in the semiconductor substrate so as to extend in the first direction, face the plurality of n-type source regions with the first p-type region interposed therebetween, and face the plurality of n-type drain regions with the first p-type region interposed therebetween. A distance between one first n-type region among the plurality of first n-type regions and the plurality of source electrodes is less than a distance between the one first n-type region and the plurality of drain electrodes.

Figure 1B:
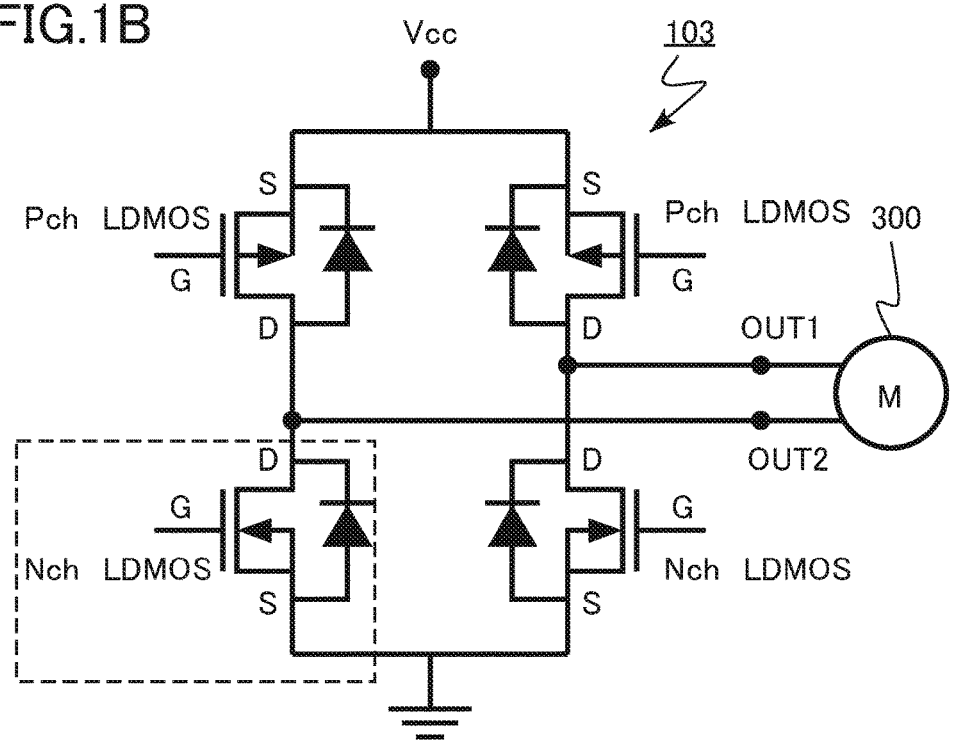

FIGS. 1A and 1B are diagrams schematically illustrating a semiconductor device according to an embodiment. FIG.

1A is a block diagram illustrating the semiconductor device and FIG. 1B is a circuit diagram illustrating a portion of the semiconductor device.

The semiconductor device according to the embodiment is a motor driver 100 that drives and controls a motor. As illustrated in FIG. 1A, the motor driver 100 outputs driving power to drive and control a motor 300 on the basis of, for example, a control signal from a microcontroller 200.

The motor driver 100 includes a controller circuit 101, a pre-driver circuit 102, and an H-bridge circuit 103. The controller circuit 101 controls the overall operation of the motor driver 100. The pre-driver circuit 102 generates a driving current for driving the H-bridge circuit 103. The H-bridge circuit 103 generates a driving current for the motor 300 and outputs the driving current. The controller circuit 101, the pre-driver circuit 102, and the H-bridge circuit 103 of the motor driver 100 are formed on the same semiconductor substrate and are integrated into one chip.

FIG. 1B is a circuit diagram illustrating the H-bridge circuit 103. In the H-bridge circuit 103, a high-side transistor is a p-channel laterally diffused metal oxide semiconductor (LDMOS) transistor and a low side-transistor is an n-channel LDMOS transistor. For example, a power supply voltage (Vcc) is applied to a high side and a low side is fixed to a ground potential. The driving current for the motor 300 is output from a first output terminal (OUT1) and a second output terminal (OUT2) of the H-bridge circuit 103.

Figure 2:
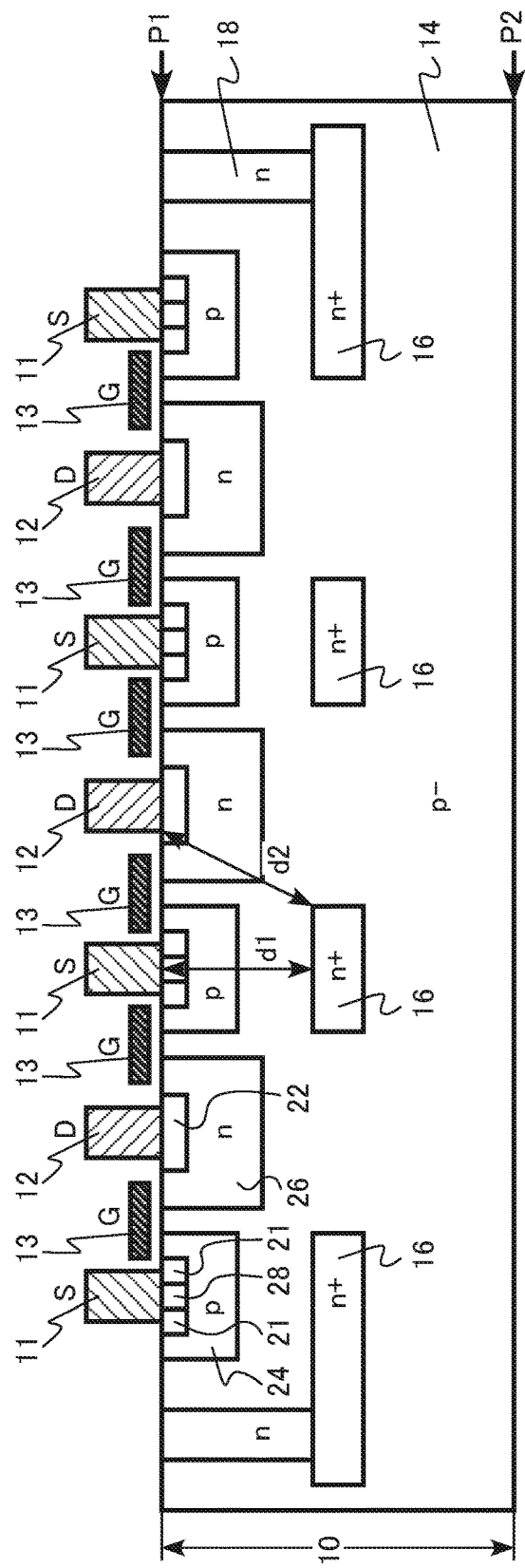
FIG. 2 is a diagram schematically illustrating a portion of the semiconductor device according to the embodiment.
Figure 3:
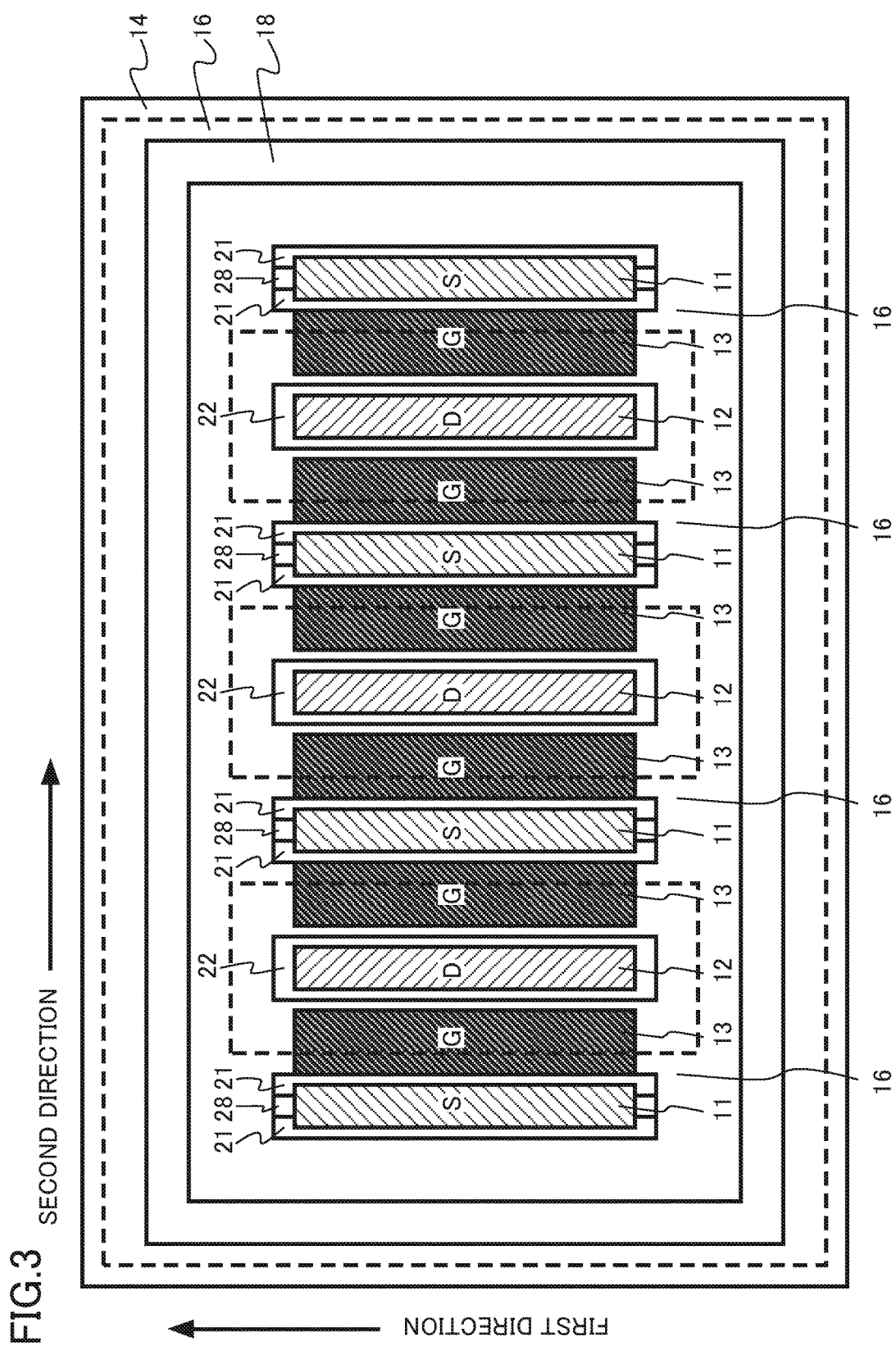
FIG. 3 is a diagram schematically illustrating a portion of the semiconductor device according to the embodiment.

FIGS. 2 and 3 are diagrams schematically illustrating a portion of the semiconductor device according to the embodiment. FIGS. 2 and 3 are diagrams schematically illustrating the low-side n-channel LDMOS transistor of the H-bridge circuit 103 which is surrounded by a dotted frame in FIG. 1B. FIG. 2 is a cross-sectional view and FIG. 3 is a top view.

The n-channel LDMOS transistor includes a semiconductor substrate 10, a plurality of source electrodes 11, a plurality of drain electrodes 12, and a plurality of gate electrodes 13. The semiconductor substrate 10 includes a p-type region 14 which is a p⁻ region, a plurality of n⁺ buried regions 16 (first n-type regions), an n-type connection region 18 (second n-type region), a plurality of n-type source regions 21 which are n⁺ regions, a plurality of n-type drain regions 22 which are n⁺ regions, a plurality of p-type p well regions 24 (second p-type regions), a plurality of n-type drift regions 26 (third n-type regions), and a plurality of p well contact regions 28 which are p⁺ regions.

The semiconductor substrate 10 has a first plane (P1 in FIG. 2) and a second plane (P2 in FIG. 2). The first plane is a front surface of the semiconductor substrate 10 and the second plane is a rear surface of the semiconductor substrate 10.

The semiconductor substrate 10 is, for example, a silicon (Si) single-crystal substrate. The first plane is, for example, the (001) face of silicon.

The source electrode 11 is provided on the front surface of the semiconductor substrate 10. A plurality of source electrodes 11 are arranged in the second direction. The source electrode 11 extends, for example, in the first direction.

The source electrode 11 is, for example, a metal electrode. For example, a silicide layer for reducing contact resistance may be provided between the source electrode 11 and the semiconductor substrate 10.

The drain electrode 12 is provided on the front surface of the semiconductor substrate 10. A plurality of drain electrodes 12 are arranged in the second direction. The drain electrode 12 extends, for example, in the first direction. The drain electrode 12 is provided between two source electrodes 11.

The drain electrode 12 is, for example, a metal electrode. For example, a silicide layer for reducing contact resistance may be provided between the drain electrode 12 and the semiconductor substrate 10.

The gate electrode 13 is provided on or above the front surface of the semiconductor substrate 10. A plurality of gate electrodes 13 are arranged in the second direction. The gate electrode 13 extends, for example, in the first direction. The gate electrode 13 is provided between the source electrode 11 and the drain electrode 12.

The gate electrode 13 is made of, for example, polysilicon doped with impurities. A gate insulating layer (not illustrated) is provided between the gate electrode 13 and the semiconductor substrate 10.

The p-type region 14 which is a p⁻ region is provided in the semiconductor substrate 10. The p-type region 14 includes, for example, boron (B) as p-type impurities. The p-type impurity concentration of the p-type region 14 is, for example, equal to or greater than $1 \times 10^{15}$ cm$^{-3}$ and equal to or less than $1 \times 10^{16}$ cm$^{-3}$.

A plurality of n-type source regions 21 which are n⁺ regions are provided in the semiconductor substrate 10. A plurality of n-type source regions 21 are provided in the second direction. The n-type source region 21 extends in the first direction. The n-type source region 21 is electrically connected to the source electrode 11.

The n-type source region 21 includes, for example, phosphorous (P) or arsenic (As) as n-type impurities. The n-type impurity concentration of the n-type source region 21 is, for example, equal to or greater than $1 \times 10^{20}$ cm$^{-3}$ and equal to or less than $1 \times 10^{22}$ cm$^{-3}$.

A plurality of n-type drain regions 22 which are n⁺ regions are provided in the semiconductor substrate 10. A plurality of n-type drain regions 22 are provided in the second direction. The n-type drain region 22 extends in the first direction. The n-type drain region 22 is electrically connected to the drain electrode 12.

The n-type drain region 22 includes, for example, phosphorous (P) or arsenic (As) as n-type impurities. The n-type impurity concentration of the n-type drain region 22 is, for example, equal to or greater than $1 \times 10^{20}$ cm$^{-3}$ and equal to or less than $1 \times 10^{22}$ cm$^{-3}$.

A plurality of p-type p well regions 24 are provided in the semiconductor substrate 10. The p well region 24 is provided between the n-type source region 21 and the p-type region 14.

The p well region 24 includes, for example, boron (B) as p-type impurities. The p-type impurity concentration of the p well region 24 is higher than the p-type impurity concentration of the p-type region 14. The p-type impurity concentration of the p well region 24 is, for example, equal to or greater than $1 \times 10^{17}$ cm$^{-3}$ and equal to or less than $1 \times 10^{19}$ cm$^{-3}$.

A portion of the p well region 24 which faces the gate electrode 13 functions as a channel region of the LDMOS transistor.

A plurality of n-type drift regions 26 are provided in the semiconductor substrate 10. The drift region 26 is provided between the n-type drain region 22 and the p-type region 14.

The drift region 26 includes, for example, phosphorous (P) or arsenic (As) as n-type impurities. The n-type impurity concentration of the drift region 26 is lower than the n-type impurity concentration of the n-type drain region 22. The n-type impurity concentration of the drift region 26 is, for example, equal to or greater than $1 \times 10^{17}$ cm$^{-3}$ and equal to or less than $1 \times 10^{19}$ cm$^{-3}$.

A plurality of p well contact regions 28 which are p$^+$ regions are provided in the semiconductor substrate 10. The p well contact region 28 is provided between the source electrode 11 and the p well region 24. The p well region 24 is provided so as to be interposed between two n-type source regions 21. A plurality of p well contact regions 28 are provided in the second direction. The p well contact region 28 extends in the first direction. The p well contact region 28 is electrically connected to the source electrode 11.

The p well contact region 28 includes, for example, boron (B) as p-type impurities. The p-type impurity concentration of the p-type region 14 is higher than the p-type impurity concentration of the p well region 24. The p-type impurity concentration of the p-type region 14 is, for example, equal to or greater than $1 \times 10^{20}$ cm$^{-3}$ and equal to or less than $1 \times 10^{22}$ cm$^{-3}$.

A plurality of n$^+$ buried regions 16 are provided in the semiconductor substrate 10. The buried region 16 faces the n-type source region 21 and the n-type drain region 22, with the p-type region 14 interposed therebetween. A plurality of buried regions 16 are provided so as to be separated from each other in the second direction. The p-type region 14 is present between two buried regions 16.

The buried region 16 extends in the first direction. A plurality of buried regions 16 are provided in the second direction. For example, the ends of the plurality of buried regions 16 in the first direction may be connected to each other.

In the top view of FIG. 3, the pattern of the buried region 16 in the semiconductor substrate 10 is represented by a dotted line. FIG. 3 illustrates a case in which the ends of the plurality of buried regions 16, which extend in the first direction, in the first direction are connected to each other.

The buried region 16 is divided immediately below the n-type drain region 22. In other words, the buried region 16 is not provided immediately below the n-type drain region 22. The buried region 16 is provided below the n-type source region 21.

The distance (d1 in FIG. 2) between the buried region 16 and the source electrode 11 is less than the distance (d2 in FIG. 2) between the buried region 16 and the drain electrode 12. Here, it is assumed that both the distance between the buried region 16 and the source electrode 11 and the distance between the buried region 16 and the drain electrode 12 mean the shortest distance.

The buried region 16 includes, for example, antimony (Sb). The n-type impurity concentration of the buried region 16 is, for example, equal to or greater than $1 \times 10^{20}$ cm$^{-3}$ and equal to or less than $1 \times 10^{22}$ cm$^{-3}$.

The width of the buried region 16 in a depth direction is, for example, equal to or greater than 1 µm and equal to or less than 3 µm.

The buried region 16 is fixed to, for example, the ground potential.

The n-type connection region 18 is provided in the semiconductor substrate 10. The connection region 18 is provided so as to surround the plurality of n-type source regions 21 and the plurality of n-type drain regions 22.

The connection region 18 comes into contact with the front surface of the semiconductor substrate 10. In addition, the connection region 18 comes into contact with an outer circumferential portion of the buried region 16.

The connection region 18 has a function of fixing the potential of the buried region 16.

Next, the function and effect of the embodiment will be described.

Figure 4:
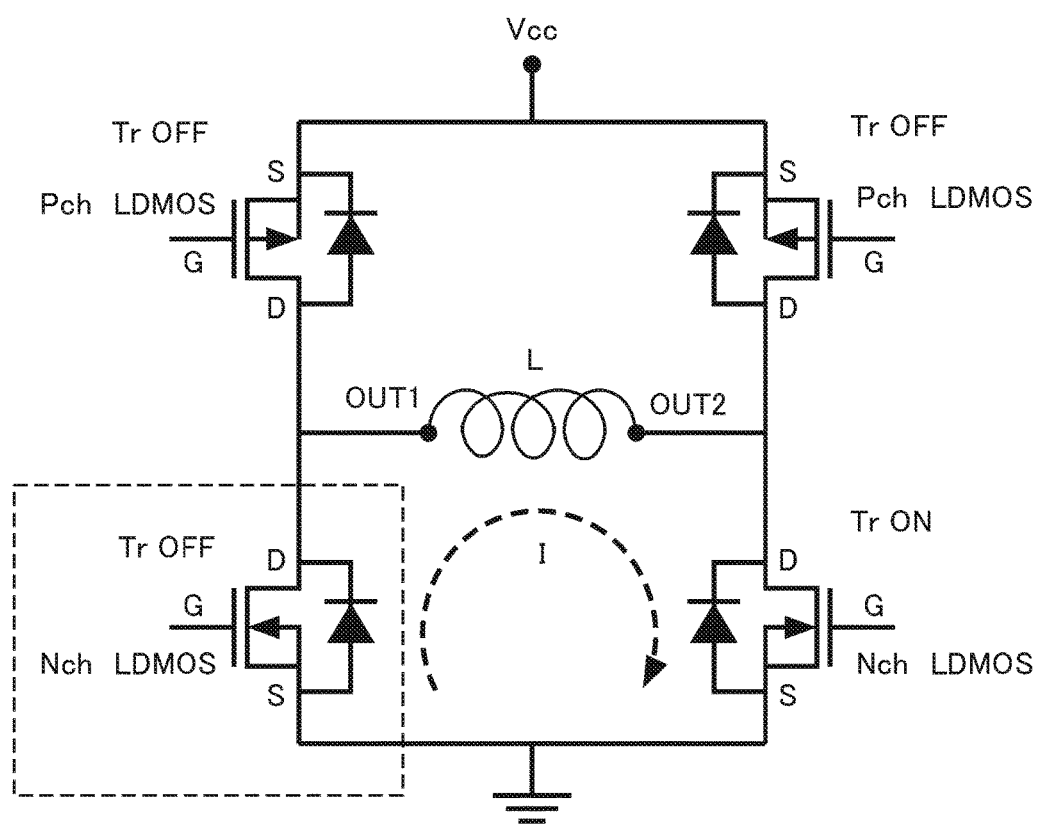
FIG. 4 is a diagram illustrating the task of the embodiment.

FIG. 4 is a diagram illustrating the problem to be solved of the embodiment. FIG. 4 illustrates the operation of a half bridge circuit.

An inductive load (load L), such as a motor, is connected to the output of the half bridge circuit. A period for which both the high-side p-channel LDMOS transistor and the low-side n-channel LDMOS transistor are turned off is provided in order to prevent a through current from flowing from the power supply to the ground when the flow of a driving current to the inductive load is stopped.

At that time, as illustrated in FIG. 4, a return current (a dotted arrow in FIG. 4) flows to a body diode of the low-side n-channel LDMOS transistor represented by a dotted frame in FIG. 4 by the back electromotive force of the inductive load.

Figure 5:
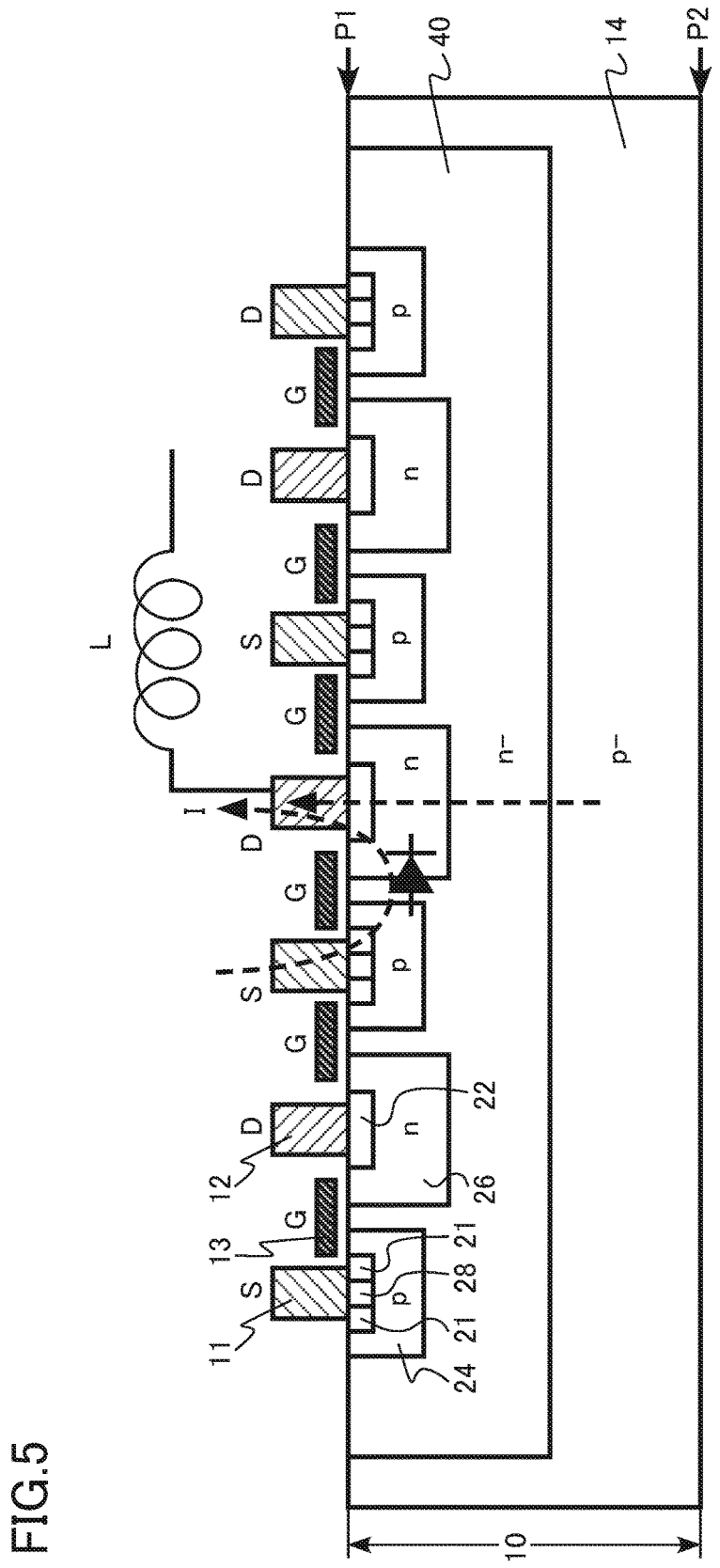
FIG. 5 is a cross-sectional view schematically illustrating a portion of a semiconductor device according to a first comparative example.

FIG. 5 is a cross-sectional view schematically illustrating a portion of a semiconductor device according to a first comparative example. The semiconductor device according to the first comparative example is a motor driver as in the embodiment.

FIG. 5 is a diagram schematically illustrating the low-side n-channel LDMOS transistor of the H-bridge circuit which is represented by a dotted frame in FIG. 4.

The n-channel LDMOS transistor in the first comparative example differs from the n-channel LDMOS transistor in the embodiment in that the transistor is surrounded by an n$^-$ well region 40.

When a return current flows the n-channel LDMOS transistor in the first comparative example, a current is drawn from the source electrode 11 to the drain electrode 12. In addition, a current is drawn from the p-type region 14 through the well region 40.

For example, the current that flows to the p-type region 14 is drawn from the source or the drain of a high-side p-channel LDMOS transistor that is formed on the same semiconductor substrate so as to be adjacent to the n-channel LDMOS transistor. In this case, a parasitic thyristor is turned on and latch-up occurs. As a result, there is a concern that the element will be broken.

For example, it is considered to increase the distance between the n-channel LDMOS transistor and the p-channel LDMOS transistor in order to prevent the parasitic thyristor from being turned on. In addition, for example, it is considered that an n-type dummy region for drawing a current is provided between the n-channel LDMOS transistor and the p-channel LDMOS transistor. However, in this case, an area penalty increases and the area of a chip increases, which is not preferable.

Figure 6:
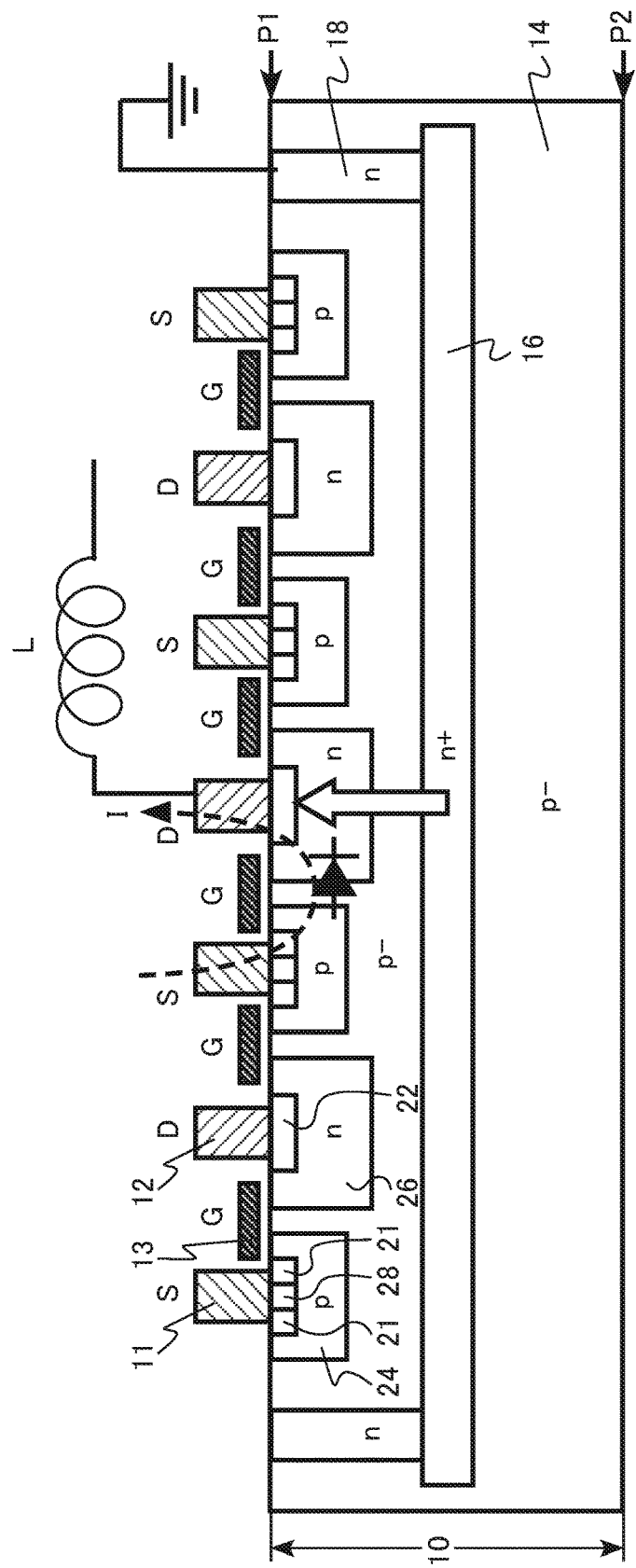
FIG. 6 is a cross-sectional view schematically illustrating a portion of a semiconductor device according to a second comparative example.

FIG. 6 is a cross-sectional view schematically illustrating a portion of a semiconductor device according to a second comparative example. The semiconductor device according to the second comparative example is a motor driver as in the embodiment.

FIG. 6 is a diagram schematically illustrating the low-side n-channel LDMOS transistor of the H-bridge circuit which is represented by a dotted frame in FIG. 4.

The n-channel LDMOS transistor in the second comparative example differs from the n-channel LDMOS transistor in the embodiment in that the buried region 16 is not divided and the transistor is completely separated from the p-type region 14.

In the n-channel LDMOS transistor in the second comparative example, when a return current flows to the n-channel LDMOS transistor, a current is prevented from being drawn from the p-type region 14. Therefore, latch-up is prevented. In addition, it is not necessary to increase the distance between the n-channel LDMOS transistor and the p-channel LDMOS transistor or to provide an n-type dummy region. As a result, it is possible to prevent an increase in the area of a chip.

However, when the buried region 16 is fixed to the ground potential, there is a concern that a breakdown voltage between the buried region 16 provided immediately below the n-type drain region 22 and the n-type drain region 22 (a white arrow in FIG. 6) will be reduced.

Figure 7:
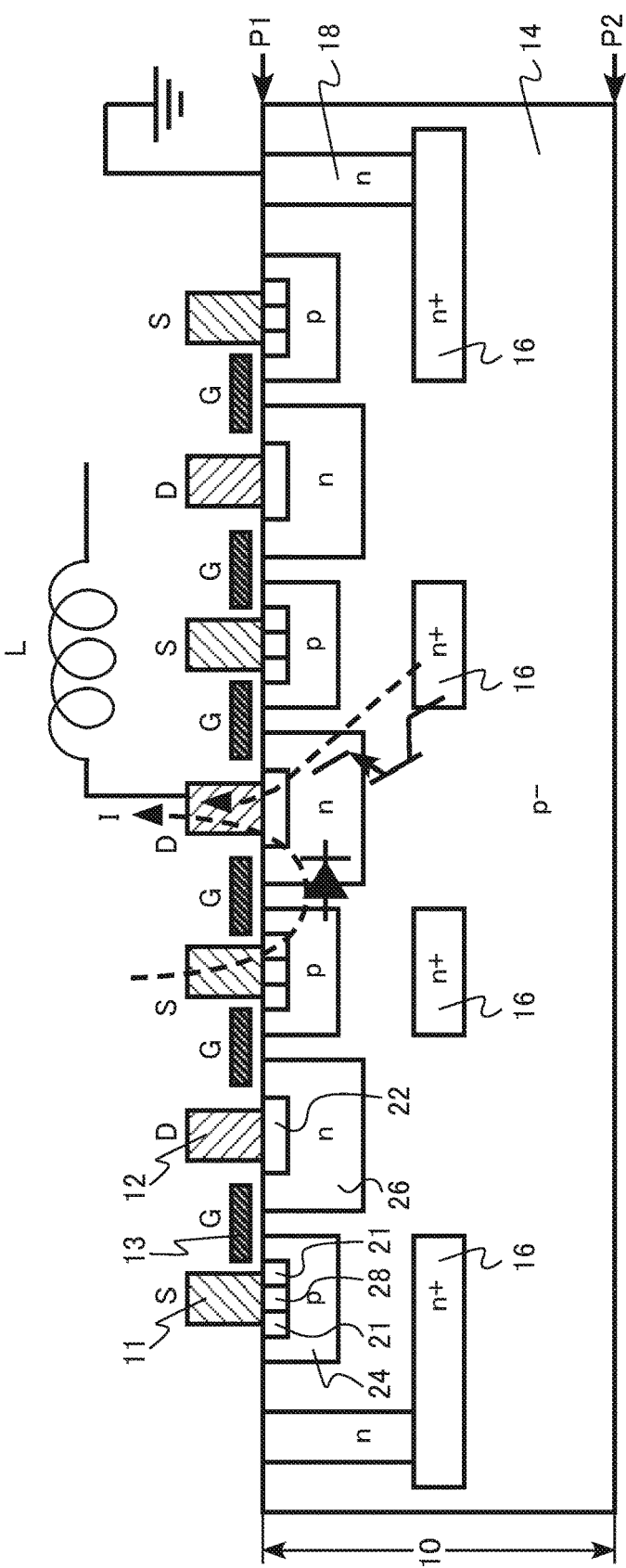
FIG. 7 is a diagram illustrating the function and effect of the semiconductor device according to the embodiment.

FIG. 7 is a diagram illustrating the function and effect of the semiconductor device according to the embodiment.

In the n-channel LDMOS transistor in the embodiment, the buried region 16 is divided. In addition, the buried region 16 is not provided immediately below the n-type drain region 22. Therefore, the distance between the n-type drain region 22 and the buried region 16 or the distance between the drift region 26 and the buried region 16 increases and the breakdown voltage between the buried region 16 and the n-type drain region 22 is improved.

When a return current flows to the n-channel LDMOS transistor, a current is drawn from the buried region 16 by the operation of a parasitic npn transistor formed by the buried region 16, the p-type region 14, and the drift region 26. Therefore, a current is prevented from being drawn from the p-type region 14. As a result, a current is prevented from being drawn from, for example, an adjacent p-channel LDMOS transistor and latch-up is prevented.

In the case of the n-channel LDMOS transistor in the embodiment, similarly to the second comparative example, it is not necessary to increase the distance between the n-channel LDMOS transistor and the p-channel LDMOS transistor or to provide an n-type dummy region. Therefore, it is possible to prevent an increase in the area of a chip.

It is preferable that the distance between two buried regions 16 be long in order to improve the breakdown voltage between the buried region 16 and the n-type drain region 22. From this point of view, it is preferable that the distance between two buried regions 16 be greater than the width of the n-type drain region 22. It is more preferable that the distance between two gate electrodes 13 having the drain electrode 12 interposed therebetween be long. It is most preferable that the distance between two gate electrodes 13 be greater than the width of the drift region 26.

In contrast, it is preferable that the distance between two buried regions 16 be short in order to increase the on-current of the parasitic npn transistor. From this point of view, it is preferable that the distance between two buried regions 16 be less than the distance between two adjacent n-type source regions 21 having the n-type drain region 22 interposed therebetween. It is more preferable that the distance between two buried regions 16 is less than the distance between two p well regions 24.

The potential of the buried region 16 may be higher than, for example, the ground potential. When the potential of the buried regions 16 is higher than the ground potential, it is possible to increase the on-current of the parasitic npn transistor.

In the embodiment, the example in which the semiconductor device is a motor driver has been described. The invention is not limited to the application to the motor driver. The invention can be applied to any type of semiconductor device as long as the semiconductor device includes an n-channel LDMOS transistor that can be connected to an inductive load.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first plane and a second plane;
   a plurality of source electrodes provided on the first plane;
   a plurality of drain electrodes provided on the first plane, the plurality of drain electrodes provided between the plurality of source electrodes;
   a plurality of gate electrodes provided on or above the first plane, the plurality of gate electrodes provided between the plurality of source electrodes and the plurality of drain electrodes;
   a first p-type region provided in the semiconductor substrate,
   a plurality of n-type source regions provided in the semiconductor substrate, the plurality of n-type source regions extending in a first direction, the plurality of n-type source regions being electrically connected to the plurality of source electrodes;
   a plurality of n-type drain regions provided in the semiconductor substrate, the plurality of n-type drain regions extending in the first direction, the plurality of n-type drain regions being electrically connected to the plurality of drain electrodes; and
   a plurality of first n-type regions provided in the semiconductor substrate, the plurality of first n-type regions extending in the first direction, the first p-type region being interposed between the plurality of first n-type regions and the plurality of n-type source regions, the first p-type region being interposed between the plurality of first n-type regions and the plurality of n-type drain regions,
   wherein a distance between one first n-type region among the plurality of first n-type regions and the plurality of source electrodes is less than a distance between the one first n-type region and the plurality of drain electrodes.

2. The semiconductor device according to claim 1, further comprising:
   a second n-type region provided in the semiconductor substrate, the second n-type region surrounding the plurality of n-type source regions and the plurality of n-type drain regions, the second n-type region contacting the first plane and the plurality of first n-type regions.

3. The semiconductor device according to claim 1, wherein the first n-type region is fixed to a ground potential.

4. The semiconductor device according to claim 1, wherein the plurality of source electrodes, the plurality of drain electrodes, and the plurality of gate electrodes extend in the first direction.

5. The semiconductor device according to claim 1, further comprising:
   a plurality of second p-type regions provided in the semiconductor substrate, the plurality of second p-type regions provided between the plurality of n-type source regions and the first p-type region, the plurality of second p-type regions having a higher p-type impurity concentration than the first p-type region; and a plurality of third n-type regions provided in the semiconductor substrate, the plurality of third n-type regions provided between the plurality of n-type drain regions and the first p-type region, the plurality of third n-type regions having a lower n-type impurity concentration than the plurality of n-type drain regions.

6. The semiconductor device according to claim 1, wherein the first n-type region includes antimony (Sb).

7. The semiconductor device according to claim 1, wherein an n-type impurity concentration of the first n-type region is equal to or greater than $1 \times 10^{20}$ cm$^{-3}$ and equal to or less than $1 \times 10^{22}$ cm$^{-3}$.

8. The semiconductor device according to claim 1, wherein a distance between the first n-type regions adjacent to each other is greater than a width of the n-type drain region.

9. The semiconductor device according to claim 1, wherein a distance between the first n-type regions adjacent to each other is greater than a distance between two gate electrodes having the n-type drain region interposed therebetween.

10. The semiconductor device according to claim 1, wherein a distance between the first n-type regions adjacent to each other is less than a distance between two n-type source regions having the n-type drain region interposed therebetween.

11. The semiconductor device according to claim 5, wherein a distance between the first n-type regions adjacent to each other is less than a distance between two second p-type regions.

12. The semiconductor device according to claim 1, wherein the semiconductor substrate is made of silicon.

13. The semiconductor device according to claim 1, wherein the plurality of gate electrodes are separated respectively at ends of the first direction.

14. The semiconductor device according to claim 1, wherein the first p-type region being interposed between the plurality of first n-type regions and the plurality of n-type source regions in a direction perpendicular to the first plane.

15. The semiconductor device according to claim 1, wherein the first p-type region being interposed between any one of the plurality of first n-type regions and any one of the plurality of n-type drain regions.

16. The semiconductor device according to claim 1, wherein the first p-type region being interposed between one of the plurality of first n-type regions and one of the plurality of n-type drain regions closest to the one of the plurality of first n-type regions.

17. The semiconductor device according to claim 1, wherein a distance between one first n-type region among the plurality of first n-type regions and one source electrode among the plurality of source electrodes closest to the one first n-type region is less than a distance between the one first n-type region and one drain electrode among the plurality of drain electrodes closest to the one first n-type region.

18. The semiconductor device according to claim 1, wherein the first p-type region is interposed between the plurality of first n-type regions and the plurality of n-type source regions in a direction from the second plane to the first plane.

19. The semiconductor device according to claim 1, wherein the first p-type region is interposed between the plurality of first n-type regions and the plurality of n-type drain regions in a direction from the second plane to the first plane.

* * * * *